(12) United States Patent
Kim

(10) Patent No.: US 9,103,014 B2
(45) Date of Patent: Aug. 11, 2015

(54) DISPLAY PANEL AND METHOD OF MANUFACTURING THE DISPLAY PANEL

(71) Applicant: SAMSUNG DISPLAY CO., LTD., Yongin, Gyeonggi-Do (KR)

(72) Inventor: Kyung-Han Kim, Yongin (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 0 days.

(21) Appl. No.: 14/017,379

(22) Filed: Sep. 4, 2013

(65) Prior Publication Data

US 2014/0209933 A1    Jul. 31, 2014

(30) Foreign Application Priority Data

Jan. 25, 2013  (KR) .................. 10-2013-0008634

(51) Int. Cl.
 *H01L 33/08* (2010.01)
 *C23C 14/04* (2006.01)
 *H01L 51/56* (2006.01)
 *H01L 27/32* (2006.01)

(52) U.S. Cl.
 CPC .......... *C23C 14/042* (2013.01); *H01L 27/3246* (2013.01); *H01L 51/56* (2013.01)

(58) Field of Classification Search
 CPC ............................................. H01L 33/08
 See application file for complete search history.

(56) References Cited

U.S. PATENT DOCUMENTS

| | | | |
|---|---|---|---|
| 7,821,199 B2* | 10/2010 | Arai et al. .................. 313/506 |
| 2006/0164786 A1* | 7/2006 | Kobayashi et al. .......... 361/234 |
| 2008/0145521 A1* | 6/2008 | Guo et al. .................. 427/75 |
| 2008/0316790 A1* | 12/2008 | Inoue et al. ................ 365/103 |
| 2009/0124033 A1* | 5/2009 | Moriyama ................. 438/29 |
| 2011/0053301 A1 | 3/2011 | Kang et al. | |

FOREIGN PATENT DOCUMENTS

| | | |
|---|---|---|
| KR | 10-2003-0047630 A | 6/2003 |
| KR | 10-2006-0008602 A | 1/2006 |
| KR | 10-2011-0022513 A | 3/2011 |

\* cited by examiner

*Primary Examiner* — Matthew Reames
(74) *Attorney, Agent, or Firm* — Lee & Morse, P.C.

(57) ABSTRACT

A method of manufacturing a display panel includes forming a pixel-defining layer on a substrate, disposing a mask on the pixel-defining layer on a first region of the substrate, and forming a first emission layer, and disposing the mask on the pixel-defining layer on a second region of the substrate, and forming a second emission layer.

13 Claims, 3 Drawing Sheets

DISPLAY PANEL AND METHOD OF MANUFACTURING THE DISPLAY PANEL

CROSS-REFERENCE TO RELATED PATENT APPLICATION

This application claims the benefit of and priority under 35 U.S.C. §119 to Korean Patent Application No. 10-2013-0008634, filed on Jan. 25, 2013, in the Korean Intellectual Property Office, and entitled: "DISPLAY PANEL AND METHOD OF MANUFACTURING THE DISPLAY PANEL," which is incorporated by reference herein in its entirety.

BACKGROUND

1. Field

Embodiments relate to a display panel and a method of manufacturing the display panel.

2. Description of the Related Art

Mobile electronic devices are extensively used. The mobile electronic devices include not only small electronic devices such as mobile phones but also include tablet personal computers (PCs) that are widely used in recent times.

The mobile electronic device supports various functions, and in this regard, in order to provide visual information such as an image to a user, the mobile electronic device has a display unit.

SUMMARY

Embodiments are directed to a method of manufacturing a display panel, the method including forming a pixel-defining layer on a substrate, disposing a mask on the pixel-defining layer on a first region of the substrate, and forming a first emission layer, and disposing the mask on the pixel-defining layer on a second region of the substrate, and forming a second emission layer.

At least one portion of a surface of the mask may be etched.

The etched surface of the mask may be fixed to a mask frame that fixes the mask.

Areas of the first emission layer and the second emission layer that are formed on the substrate may be equal.

At least five alignmarks may be formed on the substrate.

Four alignmarks of the at least five alignmarks may be formed on corners of the substrate, and at least one alignmark of the at least five alignmarks may be formed on a center region of the substrate.

The forming of the first emission layer may include aligning the first region of the substrate and the mask, contacting the mask and the substrate, and then coating the first emission layer on the mask, and separating the mask and the substrate.

The forming of the second emission layer may include moving the substrate and the mask relative to one another so as to allow the second region of the substrate to overlap with the mask, aligning the second region and the mask, and contacting the mask and the substrate, and then coating the second emission layer on the mask.

The substrate may be moved using a carrying unit.

The forming of the second emission layer may further include separating the mask and the substrate.

A substrate supporter may support corners of the substrate, in order to prevent the substrate from sagging.

A plurality of the substrate supporters may be arranged, and the plurality of the substrate supporters may be disposed to face each other so as to support the corners of the substrate, respectively.

The mask may include a contact part that contacts the substrate, and a pattern part that has a height different from a height of the contact part, and that is separated from the pixel-defining layer of the first region or the pixel-defining layer of the second region.

The mask may include a first pattern part that is disposed at a center and in which a first pattern is formed, a second pattern part that is connected with an end of the first pattern part and in which a second pattern having an array different from the first pattern is formed, and a third pattern part that is connected with another end of the first pattern part and in which a third pattern having an array different from the first pattern and the second pattern is formed.

Each of the array of the second pattern part and the array of the third pattern part may be equal to a part of an array of the first pattern part.

The second pattern part and the third pattern part may be disposed while overlapping with a part of the first region and a part of the second, according to disposal of the mask.

The second pattern and the third pattern may cross each other.

Embodiments are also directed to a display panel, including a substrate having at least five alignmarks thereon, a display unit including a pixel-defining layer that is on the substrate, and an emission layer that is on the pixel-defining layer, and an encapsulation unit that is on the display unit.

Four alignmarks of the at least five alignmarks may be on corners of the substrate, respectively, and at least one alignmark of the at least five alignmarks may be on a center region of the substrate.

The emission layer may include a first emission layer on a portion of the pixel-defining layer, and a second emission layer on residual portions of the pixel-defining layer.

The first emission layer and the second emission layer may be formed by using a same mask.

The first emission layer and the second emission layer may be formed while crossing each other on at least one portion of the pixel-defining layer.

BRIEF DESCRIPTION OF THE DRAWINGS

The above and other features and advantages will become more apparent by describing in detail example embodiments thereof with reference to the attached drawings in which.

DETAILED DESCRIPTION

Example embodiments will now be described more fully with reference to the accompanying drawings. Embodiments may, however, be implemented in many different forms and should not be construed as being limited to the example embodiments set forth herein; rather, these example embodiments are provided so that this disclosure will be thorough and complete, and will fully convey the embodiments to those of skill in the art. The terms or words used in the following description should not be construed as limiting the spirit and scope of the following claims but should be construed as describing the embodiments. Throughout the specification, a singular form may include plural forms, unless there is a particular description contrary thereto. Also, terms such as "comprise" or "comprising" are used to specify existence of a recited component, a process, an operation, and/or an element, not excluding the existence of one or more other recited components, one or more other processes, one or more other operations, and/or one or more other elements. While terms "first" and "second" are used to describe various components, it is obvious that the components are not limited to the terms "first" and "second". The terms "first" and "second" are used only to distinguish between each component.

Expressions such as "at least one of," when preceding a list of elements, modify the entire list of elements and do not modify the individual elements of the list.

Figure 1:
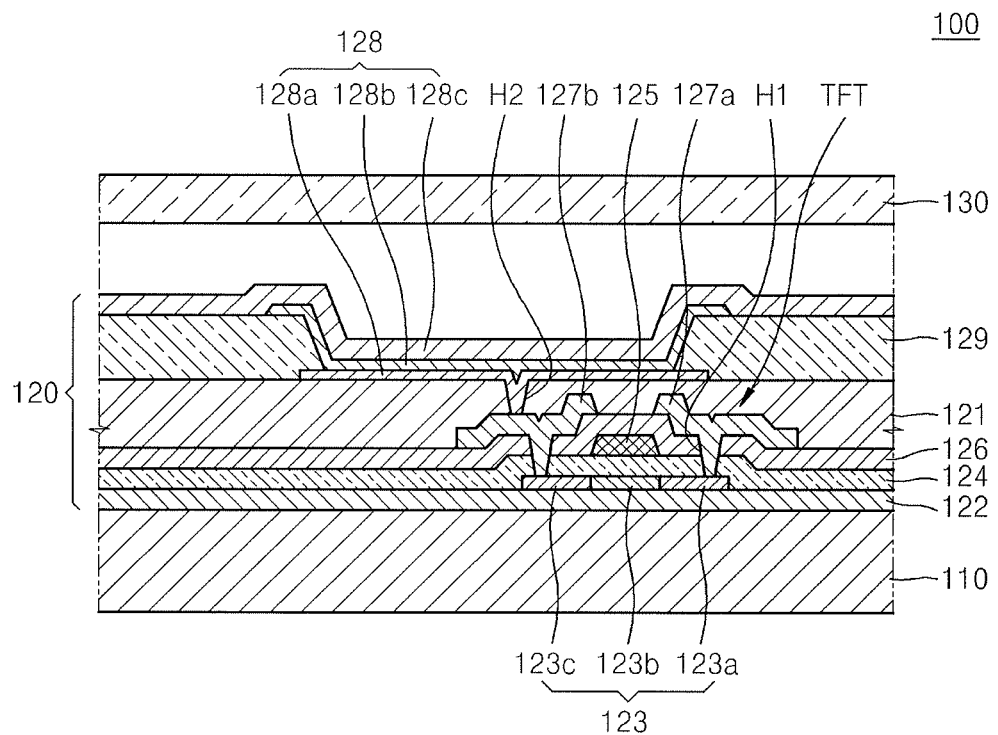
FIG. 1 is a diagram of a display panel according to an example embodiment.
Figure 2:
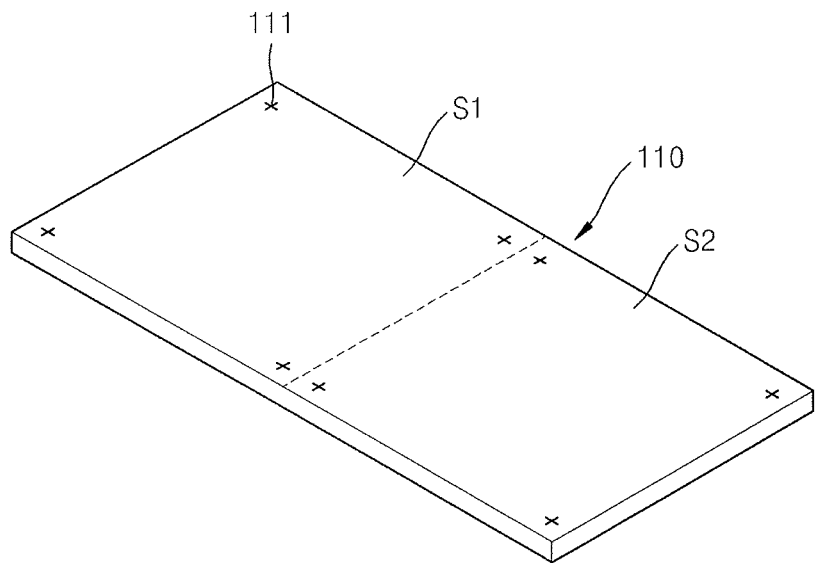
FIG. 2 is a perspective view illustrating a substrate shown in FIG. 1.

FIG. 1 is a diagram of a display panel 100 according to an example embodiment. FIG. 2 is a perspective view illustrating a substrate 110 shown in FIG. 1.

Referring to FIGS. 1 and 2, the display panel 100 may include the substrate 110, a display unit 120, and an encapsulation unit 130.

The display unit 120 may be formed on the substrate 110. The display unit 120 may have a structure in which a thin film transistor (TFT) is arranged, a passivation layer 121 is formed to cover the TFT, and an organic light emitting diode (OLED) 128 is formed on the passivation layer 121.

The substrate 110 may be formed of a glass material, but a material of the substrate 110 is not limited thereto and thus may be formed of a plastic material or a metal material such as SUS (stainless steel), Ti, or the like.

An alignmark 111 may be formed on a surface of the substrate 110 so as to align the substrate 110 and a mask (described below). In an implementation, a plurality of the alignmarks 110 may be formed. For example, at least three alignmarks 111 may be formed.

For example, at least two alignmarks 111 from among the plurality of alignmarks 111 may be formed on corners of the substrate 110. Also, at least one alignmark 111 from among the plurality of alignmarks 111 may be formed on a center region of the substrate 110. For example, at least one alignmark 111 from among the plurality of alignmarks 111 may be formed between the two alignmarks 111 that are formed on the corners of the substrate 110.

The substrate 110 may be divided into a first region S1 and a second region S2. An area of the first region S1 and an area of the second region S2 may be the same. For example, the TFT may be formed on each of the first region S1 and the second region S2. Also, layers (described below) may be simultaneously formed on the first region S1 and the second region S2, and a first emission layer (first EML) (not shown) and a second EML (not shown) may be sequentially formed on each of the first region S1 and the second region S2.

For example, according to a process of forming the TFT, a buffer layer 122 that is formed of an organic compound and/or an inorganic compound may be further formed on a top surface of the substrate 110 and may have a structure of $SiO_x$ ($x \geq 1$), $SiN_x$ ($x \geq 1$).

Afterward, an active layer 123 having a predetermined pattern may be formed on the buffer layer 122 and then may be covered by a gate insulating layer 124. In the present example embodiment, the active layer 123 has a source region 123a and a drain region 123c, and a channel region 123b that is interposed therebetween.

The active layer 123 may be formed in a manner that an amorphous silicon layer is formed on the buffer layer 122 and then is crystallized into a polycrystalline silicon layer, and the polycrystalline silicon layer is patterned. The source region 123a and the drain region 123c of the active layer 123 may be doped with impurity according to a TFT type such as a driving TFT (not shown), a switching TFT (not shown), or the like.

The active layer 123 may be formed of not only amorphous silicon but also formed of an oxide semiconductor. For example, the oxide semiconductor may include oxide of at least one material selected from the groups 12, 13, and 14 metal elements including zinc (Zn), indium (In), gallium (Ga), tin (Sn), cadmium (Cd), germanium (Ge) or hafnium (Hf) and composition thereof. For example, the active layer 123 may be a G-I—Z—O layer $[(In_2O_3)a(Ga_2O_3)b(ZnO)c$ layer] (where, a, b, c are real numbers that satisfy $a \geq 0$, $b \geq 0$, $c \geq 0$, respectively).

In the present example embodiment, a gate electrode 125 that corresponds to the active layer 123 and an interlayer insulating layer 126 that covers the gate electrode 125 are formed on a top surface of the gate insulating layer 124. After contact holes are formed in the interlayer insulating layer 126 and the gate insulating layer 124, a source electrode 127a and a drain electrode 127b are formed on the interlayer insulating layer 126 so as to contact the source region 123a and the drain region 123c, respectively.

The source electrode 127a and the drain electrode 127b may simultaneously form a reflective layer. Thus, the source electrode 127a and the drain electrode 127b may be formed of a material that has excellent electrical conductivity and that has a thickness suitable for optical reflection. The source electrode 127a and the drain electrode 127b may be formed of a metal material, e.g., a metal material selected from the group of Ag, Mg, Al, Pt, Pd, Au, Ni, Nd, Ir, Cr, Li, Ca, and a mixture thereof.

In the present example embodiment, the passivation layer 121 is formed on the TFT and the reflective layer, and a pixel electrode 128a of the OLED 128 is formed on the passivation layer 121. The pixel electrode 128a contacts the drain electrode 127b of the TFT via a via hole H2 that is formed in the passivation layer 121. The passivation layer 121 may have a structure in which an inorganic layer and/or an organic layer are singularly or multiply stacked. In this regard, the passivation layer 121 may be formed as a planarization layer having a planar top surface, regardless of unevenness of a layer formed therebelow, or may be uneven according to the unevenness of the layer formed therebelow. The passivation layer 121 may be formed of a transparent insulating material so as to achieve a resonance effect.

In the present example embodiment, after the pixel electrode 128a is formed on the passivation layer 121, a pixel-defining layer (PDL) 129 that is formed of an organic material and/or an inorganic material is formed to cover the pixel electrode 128a and the passivation layer 121 and then is opened to expose the pixel electrode 128a.

Afterward, an EML 128b and an opposite electrode 128c are formed at least on the pixel electrode 128a.

The pixel electrode 128a functions as an anode electrode and the opposite electrode 128c functions as a cathode electrode, but polarity of the pixel electrode 128a and polarity of the opposite electrode 128c may be switched.

The pixel electrode 128a may be formed of a material having a high work function, e.g., a transparent conductive material including ITO, IZO, $In_2O_3$, ZnO, or the like.

The opposite electrode 128c may be formed of a low work-function metal material including, e.g., Ag, Mg, Al, Pt, Pd, Au, Ni, Nd, Ir, Cr, Li, Ca, or mixture of any of these. For example, the opposite electrode 128c may be formed as a thin transflective layer including Mg, Ag, Al or the like which transmits light after optical resonance.

In the present example embodiment, the pixel electrode 128a and the opposite electrode 128c are insulated from each other by the EML 128*b* and apply voltages having different polarities to the EML 128*b*, so that emission occurs in the EML 128*b*.

The EML 128*b* may be formed as a small molecule organic layer or a polymer organic layer. When the EML 128*b* is formed as the small molecule organic layer, the EML 128*b* may have a structure in which a hole injection layer (HIL), a hole transport layer (HTL), an EML, an electron transport layer (ETL), an electron injection layer (EIL) or the like are singularly or multiply stacked, and may be formed by using one of various organic materials including, e.g., copper phthalocyanine (CuPc), N,N'-di(naphthalene-1-yl)-N,N'-diphenyl-benzidine (NPB), tris-8-hydroxyquinoline aluminum) (Alq3), or the like. The small molecule organic layers may be formed by using a vacuum deposition method. The HIL, the HTL, the ETL, and the EIL are common layers that may be commonly applied to pixels of red, green, and blue colors. Thus, unlike the embodiment of FIG. 1, the common layers and the opposite electrode 128*c* may entirely cover the pixels.

When the EML 128*b* is foamed as the polymer organic layer, the EML 128*b* may have a structure of a HTL and an EML, and The HTL may be formed of, e.g., poly(3,4-ethylenedioxythiophene) (PEDOT) and the EML may be formed of, e.g., a poly-phenylenevinylene (PPV)-based polymer organic material, a polyfluorene-based polymer organic material, or the like by using, e.g., a screen printing method, an inkjet printing method, a deposition method using a mask, or the like. Hereinafter, for convenience of description, it is assumed that the EML is formed by the deposition method using a mask.

The EML may include the first EML and the second EML. The first EML is deposited on the PDL 129 of the first region S1 of the substrate 110, and the second EML is deposited on the PDL 129 of the second region S2 of the substrate 110.

Also, the first EML and the second EML may be sequentially formed. In the present example embodiment, only one mask may be arranged and may be used when each of the first EML and the second EML is formed.

The first EML and the second EML may be similarly formed. For example, each of the first EML and the second EML may include a green EML, a blue EML, and a red EML. Also, in addition to the aforementioned color EMLs, the first EML and the second EML may include EMLs with other colors. For example, at least one of the first EML and the second EML may further include a white EML having a structure in which, e.g., a green EML, a blue EML, and a red EML are stacked.

In another implementation, at least one of the first EML and the second EML may include a white EML having a structure in which a green EML, a blue EML, and a red EML are stacked on an entire surface of the PDL 129 of each of the first region S1 and the second region S2. A color conversion layer or a color filter (not shown) may be disposed on the white EML, so that a display screen may be embodied. Hereinafter, for convenience of description, it is assumed that the green EML, the blue EML, and the red EML are separately formed.

However, the EMLs may not be limited to the aforementioned features and thus various examples may be applied thereto.

The encapsulation unit 130 may be formed on the OLED 128. The encapsulation unit 130 may be formed in a similar manner as the substrate 110. For example, the encapsulation unit 130 may be formed of a glass material that is similar to the substrate 110, but a material of the encapsulation unit 130 is not limited thereto and thus, the encapsulation unit 130 may be foamed of a plastic material. Here, a sealing member (not shown) may be formed between the substrate 110 and the encapsulation unit 130, thereby encapsulating the substrate 110 and the encapsulation unit 130.

The encapsulation unit 130 may have a structure in which an organic layer and an inorganic layer are alternately stacked. A plurality of the organic layers and a plurality of the inorganic layers may be stacked.

The organic layer may be formed of a polymer material, for example, the organic layer may have a structure in which at least one of polyethylene terephthalate, polyimide, polycarbonate, epoxy, polyethylene, and polyacrylate is singularly or multiply stacked. For example, the organic layer may be formed of polyacrylate including a polymerized monomer composition containing a diacrylate-based monomer and a triacrylate-based monomer. The monomer composition may further include monoacrylate-based monomer. Also, the monomer composition may further include a photoinitiator such as, but not limited thereto, TPO.

The inorganic layer may be a single layer or a multi-stack layer including metal oxide or metal nitride. For example, the inorganic layer may include at least one of $SiN_x$, $Al_2O_3$, $SiO_2$, and $TiO_2$.

A top layer of the encapsulation unit 130 which is externally exposed may be formed as an inorganic layer so as to prevent moisture permeation to the display unit 120.

The encapsulation unit 130 may include at least one sandwich structure in which at least one organic layer is interposed between at least two inorganic layers. The encapsulation unit 130 may include at least one sandwich structure in which at least one inorganic layer is interposed between at least two organic layers.

The encapsulation unit 130 may include a first inorganic layer, a first organic layer, and a second inorganic layer in a sequential order from a top surface of the display unit 120. The display unit 120 may include a first inorganic layer, a first organic layer, a second inorganic layer, a second organic layer, and a third inorganic layer in a sequential order from the top surface of the display unit 120. The display unit 120 may include a first inorganic layer, a first organic layer, a second inorganic layer, a second organic layer, a third inorganic layer, a third organic layer, and a fourth inorganic layer in a sequential order from the top surface of the display unit 120.

A halogenated metal layer including LiF may be formed between the display unit 120 and the first inorganic layer. The halogenated metal layer may prevent the display unit 120 from being damaged when the first inorganic layer is formed by using a sputtering method or a plasma deposition method.

The first organic layer may have an area smaller than an area of the second inorganic layer, and the second organic layer may have an area smaller than an area of the third inorganic layer. The first organic layer may be completely covered by the second inorganic layer, and the second organic layer may also be completely covered by the third inorganic layer.

Hereinafter, a method of manufacturing the display panel 100 will be described in detail.

Figure 3A:
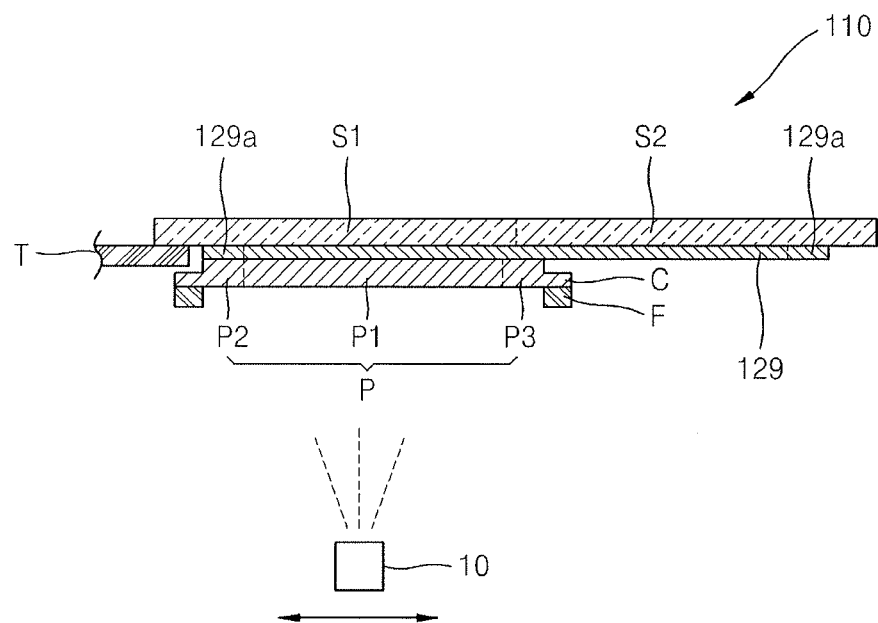
FIGS. 3A and 3B illustrate an order of manufacturing processes with respect to the display panel of FIG. 1.
Figure 3B:
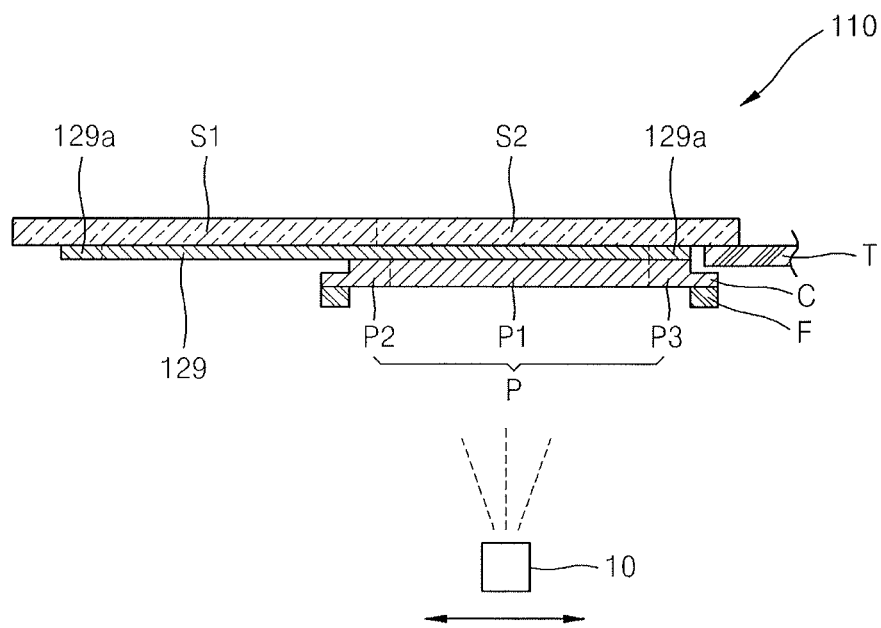
Figure 4:
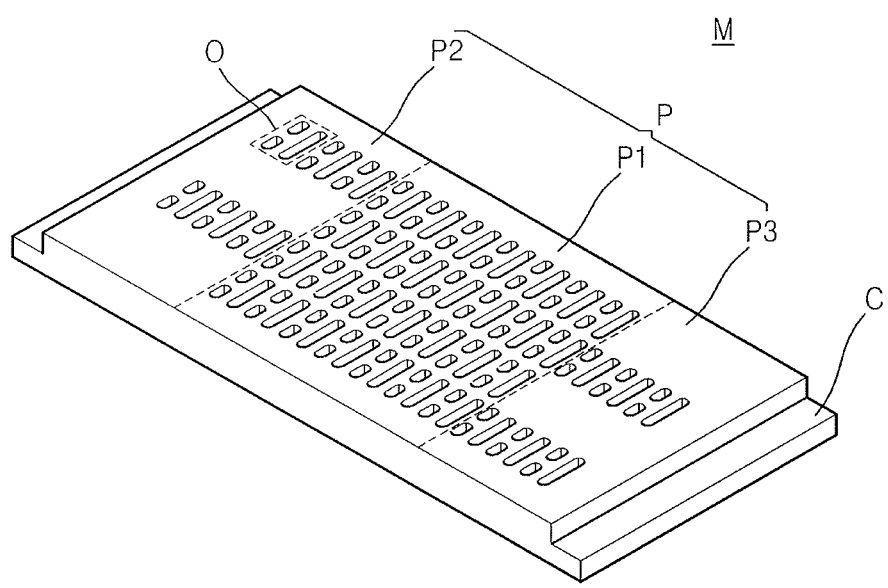
FIG. 4 is a perspective view illustrating a mask that is used in manufacturing the display panel of FIG. 3.

FIGS. 3A and 3B illustrate an order of manufacturing processes with respect to the display panel 100 of FIG. 1. FIG. 4 is a perspective view illustrating a mask M that is used in manufacturing the display panel 100 of FIG. 3. Hereinafter, like reference numerals in the above description denote like elements.

Referring to FIGS. 3A, 3B, and 4, in forming the display panel 100, the buffer layer 122, the active layer 123, the gate insulating layer 124, the gate electrode 125, the interlayer insulating layer 126, the source electrode 127*a*, the drain electrode 127*b*, the passivation layer 121, the pixel electrode 128*a*, and the PDL 129 may be sequentially stacked on the substrate 110. The buffer layer 122, the active layer 123, the gate insulating layer 124, the gate electrode 125, the interlayer insulating layer 126, the source electrode 127*a*, the drain electrode 127*b*, the passivation layer 121, the pixel electrode 128*a*, and the PDL 129 may be formed on the first region S1 and the second region S2 of the substrate 110 at one time.

When the aforementioned process is completed, the mask M may be disposed on the first region S1. The mask M may include a pattern part P (that contacts the PDL 129 on the substrate 110) and a contact part C (that has a height different from a height of the pattern part P and that is fixed to a mask frame F). For example, the pattern part P may contact an external surface of the PDL 129 and may have a thickness greater than a thickness of the contact part C. For example, the thickness of the pattern part P may be twice as great as the thickness of the contact part C. The contact part C may be combined with the mask frame F via welding so that the contact part C may extend the mask M.

In an example embodiment, the pattern part P may be disposed at a center of the mask M and may include a first pattern part P1 in which a first array pattern is formed. Also, the pattern part P may include a second pattern part P2 that is connected with an end of the first pattern part P1 and in which a second array pattern O having an array pattern different from the first array pattern is formed. The pattern part P may include a third pattern part P3 in which a third array pattern having an array pattern different from the first array pattern and the second array pattern O is formed. Here, alternatively, the pattern part P may include only the first pattern part P1, instead of including the first through third pattern parts P1 through P3. Hereinafter, for convenience of description, it is assumed that the pattern part P includes the first through third pattern parts P1 through P3.

The first array pattern may correspond to an array of the first EML or the second EML on the PDL 129 of the first region S1 or the PDL 129 of the second region S2.

On the other hand, the second array pattern O and the third array pattern may have array patterns that are the same as a part of the first array pattern. For example, the second array pattern O and the third array pattern may be formed while crossing each other, and when EMLs are formed on the same region by using the second array pattern O and the third array pattern, the EML that is formed by using the second array pattern O and the EML that is formed by using the third array pattern may have the same form as an EML that is formed by using the first array pattern. For example, the second array pattern O and the third array pattern may have at least two rows. Hereinafter, for convenience of description, it is assumed that the second array pattern O and the third array pattern have three rows.

The pattern part P may be formed with a size that is greater than the area of the first region S1 or the area of the second region S2. Here, when the mask M is disposed, the second pattern part P2 may be disposed while outwardly extending from the first region S1, the first pattern part P1 may overlap with the first region S1, and the third pattern part P3 may overlap with a part of the first region S1 and a part of the second region S2. Also, when the mask M and the second region S2 are disposed while overlapping with each other, the second pattern part P2 may overlap with a part of the first region S1 and a part of the second region S2, the first pattern part P1 and the second region S2 may overlap with each other, and the third pattern part P3 may be disposed while outwardly extending from the second region S2.

However, when the mask M includes only the first pattern part P1, an area of the first pattern part P1 may be the same as the area of the first region S1 and the area of the second region S2. Thus, when the mask M includes only the first pattern part P1, the area of the first pattern part P1 may completely overlap with the first region S1, and when the first pattern part P1 is disposed on the second region S2, the first pattern part P1 may completely overlap with the second region S2.

When the mask M is disposed in the aforementioned manner, the substrate 110 may be supported by a substrate supporter T. Here, a plurality of the substrate supporters T may be arranged, and in this regard, at least two substrate supporters T may support corners of the substrate 110 and at least other two substrate supporters T may support a center portion of the substrate 110.

When the substrate 110 is supported in the aforementioned manner, the mask M may contact the first region S1 of the substrate 110. The mask M and the first region S1 of the substrate 110 may align with each other.

For example, the mask M and the first region S1 of the substrate 110 may align each other with respect to the two alignmarks 111 from among the plurality of alignmarks 111 which are formed on the corners of the substrate 110 included in the first region S1, and the alignmark 111 from among the plurality of alignmarks 111 which is formed on the center region of the substrate 110. Here, a method of aligning the mask M with the first region S1 of the substrate 110 may be performed by using a general method of aligning a mask and a substrate, thus, detailed descriptions thereof are omitted here.

When the mask M and the first region S1 of the substrate 110 are aligned in the aforementioned manner, the mask M and the substrate 110 may contact each other. The pattern part P of the mask M may contact the PDL 129 of the first region S1. Also, the contact part C may contact the mask frame F as described above and thus may support the mask M.

When the disposal of the mask M is completed, an organic material may be coated on the mask M, so that the first EML may be formed. The organic material that forms the first EML may be coated via a source 10. For example, the source 10 may coat the organic material while the source 10 moves. Also, the first EML may be formed after the aforementioned procedure is performed several times according to a total number of colors of the first EML to be deposited (refer to FIG. 3A).

The first EML may be formed on the center portion of the first region S1 by using the first pattern part P1. On the other hand, the first EML that is formed by using the second pattern part P2 may be formed on an outer region of the PDL 129 of the first region S1, wherein the pixel electrode 128*a* is not formed on the outer region. Thus, a dummy part 129*a* may be formed on the outer region of the PDL 129 of the first region S1, and the first EML that is formed by using the second pattern part P2 may be formed on the dummy part 129*a* of the first region S1.

Also, when the first EML is formed in the aforementioned manner, the first EML that is formed by using the third pattern part P3 may be arranged on a part of the first region S1 that is adjacent to the second region S2, and a part of the second region S2 that is adjacent to the first region S1. For example, the first EML that is formed by using the third pattern part P3 may be formed only on the part of the first region S1 and a part of the pixel electrode 128*a* on the second region S2. The second EML may be formed on another part of the first region S1 or another part of the pixel electrode 128*a* on the second region S2 by using the second pattern part P2, wherein the first EML is not formed on the other parts.

When the first EML is formed in the aforementioned manner, the first EML may be deposited on the PDL 129 of the first region S1 of the substrate 110. For example, the first EML may be formed on the pixel electrode 128a as described above.

When the aforementioned process is completed, the substrate 110 and the mask M may be separated from each other, and then the substrate 110 may be moved or carried. Here, a carrying unit (not shown) may translate the substrate 110 so as to allow the second region S2 of the substrate 110 to overlap with the mask M.

When the substrate 110 is carried in the aforementioned manner, the above processes may be repeated. For example, the mask M and the second region S2 of the substrate 110 may be disposed to align each other. For example, the mask M and the substrate 110 may align each other via the alignmark 111 on the center region of the substrate 110, and the alignmarks 111 on the corners of the substrate 110 which are included in the second region S.

When the disposal of the mask M is completed as described above, the first pattern part P1 and the second pattern part P2 may overlap with a part of the first region S1 and the second region S2. For example, when the first EML is formed on the first region S1 as described above, the second region S2 may be disposed on the parts of the first region S1 and the second region S2 which overlap with the third pattern part P3. On the other hand, the third pattern part P3 may be disposed on the outer region of the second region S2. The dummy part 129a may be formed in the outer region of the second region S2 as described above, so that the second EML may be formed by using the third pattern part P3.

When the aforementioned process is completed, the mask M and the second region S2 of the substrate 110 may contact each other. The pattern part P of the mask M may be disposed to contact the PDL 129 on the second region S2 of the substrate 110.

After the mask M is disposed as described above, an organic material may be coated from the source 10 to the mask M, so that the second EML may be formed on the PDL 129 on the second region S2 of the substrate 110. The source 10 may coat the organic material while the source 10 moves. Also, the second EML may be formed after the aforementioned procedure is performed several times according to a total number of colors of the second EML to be deposited (refer to FIG. 3B).

When the second EML is formed in the aforementioned manner, the second EML may be normally formed on the second region S2 that contacts the first pattern part P1. On the other hand, the second EML that is formed by using the second pattern part P may be formed while crossing the first EML that is formed by using the third pattern part P3. When the EML is formed on a boundary region between the first region S1 and the second region S2 by using the second pattern part P2 and the third pattern part P3 as described above, it may be possible to prevent uniformity of the EMLs from being damaged due to doubly coating the EML.

When the aforementioned process is completed, the mask M may be separated from the second region S2 of the substrate 110. The carrying unit may carry and then may externally withdraw the substrate 110.

After the first and second EMLs are sequentially deposited, the opposite electrode 128c may be formed on the first and second EMLs. Afterward, the encapsulation unit 130 may be formed on the opposite electrode 128c, and then the display panel 100 may be completed.

According to an example embodiment, alternatively, when the mask M includes only the first pattern part P1, the first pattern part P1 may align each of the first region S1 and the second region S2, so that the first EML and the second EML may be separately formed. The first pattern part P1 may completely overlap with the first region S1 or the second region S2. Thus, the first EML or the second EML may be formed on with the first region S1 or the second region S2.

By way of summation and review, various parts to drive a display unit are being made smaller. Thus, the importance of the display unit in the mobile electronic device is increased, and also, a display unit is being developed to have a structure that makes the display unit bent to have a predetermined angle at a flat state.

As described above, embodiments may provide a display panel, and a method of manufacturing the display panel, whereby an emission layer (EML) may be uniformly formed for a variety of sizes of substrates. According to embodiments, a substrate may be divided for a variety of sizes of substrates and then the EML may be deposited thereon. Also, according to embodiments, an aperture ratio may be improved via improvement of accuracy by using a mask that is smaller than the substrate. In addition, according to embodiments, it may be possible to reduce a space by decreasing a size of the mask, so that space usability may be improved and production availability may be achieved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a display panel, the method comprising:
    forming a pixel-defining layer on a substrate;
    disposing a mask on the pixel-defining layer on a first region of the substrate, and forming a first emission layer on the first region; and
    moving the mask in a first direction and disposing the mask on the pixel-defining layer on a second region of the substrate, and forming a second emission layer on the second region, wherein:
    the mask includes a first pattern part, a second pattern part, and a third pattern part, the first, second, and third pattern parts being arranged in the first direction with the first pattern part interposed between the second and third pattern parts,
    the first pattern part forms a first array pattern, the second pattern part forms a second array pattern that is a subset of the first array pattern, and the third pattern part forms a third array pattern that is a subset of the first array pattern, and
    the second pattern part is complementary to the third pattern part, the second pattern part and the third pattern part combining to form an array pattern that is the same as the first array pattern formed by the first pattern part.

2. The method of claim 1, wherein at least one portion of a surface of the mask is etched.

3. The method of claim 2, wherein the etched surface of the mask is fixed to a mask frame that fixes the mask.

4. The method of claim 1, wherein:
areas of the first emission layer and the second emission layer that are formed on the substrate are equal,
the first pattern part overlaps the first region of the substrate while forming the first emission layer, and
the third pattern part overlaps part of the second region of the substrate while forming the first emission layer.

5. The method of claim 1, wherein at least five alignmarks are formed on the substrate.

6. The method of claim 5, wherein four alignmarks of the at least five alignmarks are formed on corners of the substrate, and at least one alignmark of the at least five alignmarks is formed on a center region of the substrate.

7. The method of claim 1, wherein the forming of the first emission layer includes:
aligning the first region of the substrate and the mask;
contacting the mask and the substrate, and then coating the first emission layer on the mask; and
separating the mask and the substrate.

8. The method of claim 1, wherein the forming of the second emission layer includes:
moving the substrate and the mask relative to one another so as to allow the second region of the substrate to overlap with the mask;
aligning the second region and the mask; and
contacting the mask and the substrate, and then coating the second emission layer on the mask.

9. The method of claim 8, wherein the substrate is moved using a carrying unit.

10. The method of claim 8, wherein the forming of the second emission layer further includes separating the mask and the substrate.

11. The method of claim 1, wherein a substrate supporter supports corners of the substrate, in order to prevent the substrate from sagging.

12. The method of claim 11, wherein the substrate supporter includes a plurality of the substrate supporters arranged to support the corners of the substrate, respectively.

13. The method of claim 1, wherein:
the mask includes a contact part that contacts a mask frame, and
the first, second, and third pattern parts have a height that is different from a height of the contact part, the first, second, and third pattern parts being separated from the pixel-defining layer of the first region when moving the mask to the pixel-defining layer of the second region.

* * * * *